United States Patent
Ma et al.

(10) Patent No.: US 9,170,310 B2
(45) Date of Patent: Oct. 27, 2015

(54) CRYOGENICALLY COOLED WHOLE-BODY RF COIL ARRAY AND MRI SYSTEM HAVING SAME

(75) Inventors: Qiyuan Ma, Milburn, NJ (US); Erzhen Gao, Milburn, NJ (US)

(73) Assignee: Time Medical Holdings Company Limited, George Town (KY)

( * ) Notice: Subject to any disclaimer, the term of this patent is extended or adjusted under 35 U.S.C. 154(b) by 454 days.

(21) Appl. No.: 13/469,061

(22) Filed: May 10, 2012

(65) Prior Publication Data
US 2013/0063148 A1    Mar. 14, 2013

Related U.S. Application Data

(60) Provisional application No. 61/484,620, filed on May 10, 2011.

(51) Int. Cl.
| | | |
|---|---|---|
| *G01V 3/00* | (2006.01) | |
| *G01R 33/3415* | (2006.01) | |
| *G01R 33/34* | (2006.01) | |
| *G01R 33/36* | (2006.01) | |

(52) U.S. Cl.
CPC ........ *G01R 33/3415* (2013.01); *G01R 33/3403* (2013.01); *G01R 33/34023* (2013.01); *G01R 33/3635* (2013.01)

(58) Field of Classification Search
CPC ................................................ G01R 33/34023
USPC ................... 324/318, 321, 322, 314
See application file for complete search history.

(56) References Cited

U.S. PATENT DOCUMENTS

| | | | | |
|---|---|---|---|---|
| 6,252,404 B1 * | 6/2001 | Purgill et al. | | 324/318 |
| 6,825,664 B2 * | 11/2004 | Kwok et al. | | 324/318 |
| 6,909,283 B2 * | 6/2005 | Emeric et al. | | 324/300 |
| 8,253,416 B2 * | 8/2012 | Ma et al. | | 324/318 |
| 8,593,146 B2 * | 11/2013 | Gao et al. | | 324/318 |
| 8,723,522 B2 * | 5/2014 | Ma et al. | | 324/318 |
| 2006/0132134 A1 | 6/2006 | Amm et al. | | |
| 2009/0219024 A1 | 9/2009 | Matschi | | |
| 2010/0213939 A1 | 8/2010 | Sodickson et al. | | |

OTHER PUBLICATIONS

PCT International Search Report mailed Oct. 4, 2012 in International Application No. PCT/US2012/037399, filed Dec. 28, 2012.
PCT Written Opinion of the International Searching Authority mailed Oct. 4, 2012 in International Application No. PCT/US2012/037399, filed Dec. 28, 2012.

* cited by examiner

*Primary Examiner* — Louis Arana
(74) *Attorney, Agent, or Firm* — Frommer Lawrence & Haug LLP

(57) ABSTRACT

A whole body RF coil array module configured for cryogenic cooling for use in magnetic resonance imaging. The RF coil array may be a superconducting coil array, such as a high temperature superconducting (HTS) array. The RF coil array module provides sufficiently high signal-to-noise ratio and large field of view such that the RF coil array may be used in an MRI whole body system for diagnostic imaging of all body parts without requiring using special-purpose RF coils for different body parts.

23 Claims, 11 Drawing Sheets

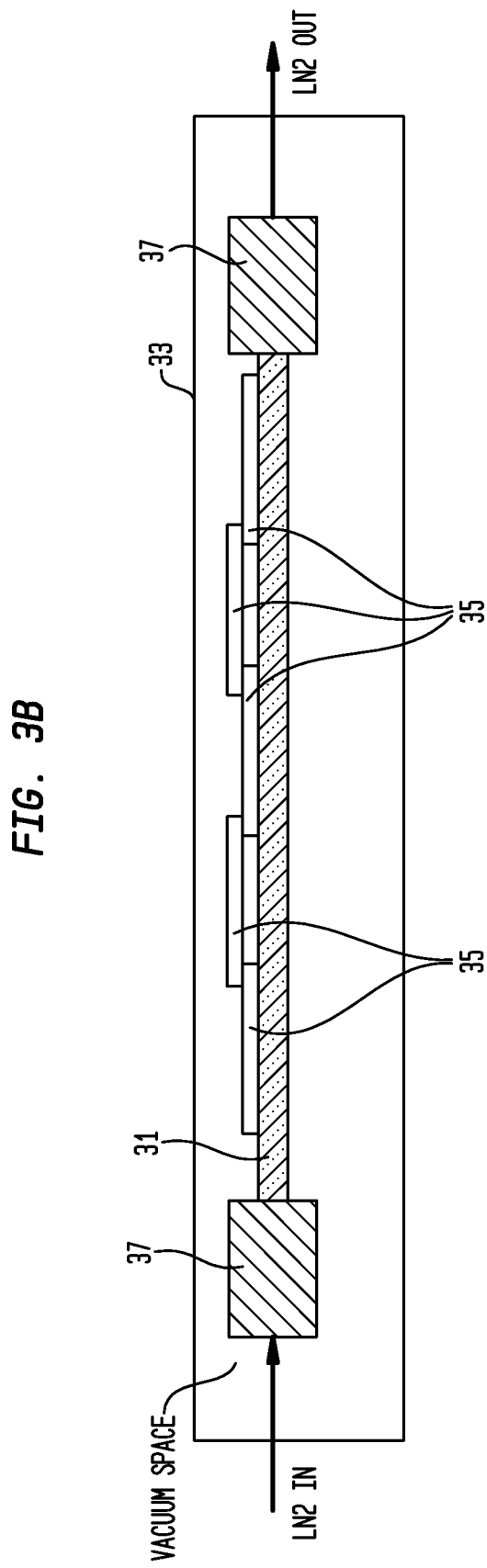

CRYOGENICALLY COOLED WHOLE-BODY RF COIL ARRAY AND MRI SYSTEM HAVING SAME

RELATED APPLICATIONS

This application claims the benefit of U.S. Provisional Application No. 61/484,620, filed May 10, 2011, which is incorporated herein by reference in its entirety.

TECHNICAL FIELD

The present invention relates generally to magnetic resonance imaging and spectroscopy, and, more particularly, to magnetic resonance imaging and spectroscopy apparatus employing superconductor components, and to methods for manufacturing such apparatus.

BACKGROUND

Magnetic Resonance Imaging (MRI) technology is commonly used today in larger medical institutions worldwide, and has led to significant and unique benefits in the practice of medicine. While MRI has been developed as a well-established diagnostic tool for imaging structure and anatomy, it has also been developed for imaging functional activities and other biophysical and biochemical characteristics or processes (e.g., blood flow, metabolites/metabolism, diffusion), some of these magnetic resonance (MR) imaging techniques being known as functional MRI, spectroscopic MRI or Magnetic Resonance Spectroscopic Imaging (MRSI), diffusion weighted imaging (DWI), and diffusion tensor imaging (DTI). These magnetic resonance imaging techniques have broad clinical and research applications in addition to their medical diagnostic value for identifying and assessing pathology and determining the state of health of the tissue examined.

During a typical MRI examination, a patient's body (or a sample object) is placed within the examination region and is supported by a patient support in an MRI scanner where a substantially constant and uniform primary (main) magnetic field is provided by a primary (main) magnet. The magnetic field aligns the nuclear magnetization of precessing atoms such as hydrogen (protons) in the body. A gradient coil assembly within the magnet creates a small variation of the magnetic field in a given location, thus providing resonance frequency encoding in the imaging region. A radio frequency (RF) coil is selectively driven under computer control according to a pulse sequence to generate in the patient a temporary oscillating transverse magnetization signal that is detected by the RF coil and that, by computer processing, may be mapped to spatially localized regions of the patient, thus providing an image of the region-of-interest under examination.

In a common MRI configuration, the static main magnetic field is typically produced by a solenoid magnet apparatus, and a patient platform is disposed in the cylindrical space bounded by the solenoid windings (i.e. the main magnet bore). The windings of the main field are typically implemented as a low temperature superconductor (LTS) material, and are super-cooled with liquid helium in order to reduce resistance, and, therefore, to minimize the amount of heat generated and the amount of power necessary to create and maintain the main field. The majority of existing LTS superconducting MRI magnets are made of a niobium-titanium (NbTi) and/or $Nb_3Sn$ material which is cooled with a cryostat to a temperature of 4.2 K.

As is known to those skilled in the art, the RF coils generally are configured to selectively provide excitation (transmit coil) and reception (receive coil) of an MRI signal. Three kinds of RF coils may be employed in common MRI scanners: a transmit coil, a receive coil, and a transceiver coil. The transmit coil is usually disposed close to the magnet so it can provide homogenous RF excitation over the whole FOV (field of view). Although the transmit coil may also be used for reception, the transmit coil is not necessarily a good receive coil for detecting the MRI signal because it is usually too far away from the patient. Accordingly, typically a separate receive coil is used, which is usually small in size and closely wrapped around the body part of the patient to be imaged so that the signal or signal-to-noise ratio (SNR) is higher. However, different receive coils have to be used for different body parts. There are usually 6 to 10 different receive coils for each MRI scanner to fit different body parts and different sizes of them. It takes time to change a coil. Rather than using separate transmit and receive coils, a transceiver coil, which combines the functions of the transmit coil and receive coil, may be implemented for some MRI scanning applications. It is common for the transmit coil of some MRI systems to be implemented as a transceiver coil. This kind of coil can image a large FOV so patient positioning is easier than using a small receive coil. However, the SNR of the images acquired by a transceiver coil is low, thus precluding diagnostic imaging when using such coils.

One way to increase the SNR of an image is to use an RF coil array. As the size of the receive coil decreases, the coil noise increases, which will affect SNR of the image. Such arrays generally have been implemented as surface coil arrays that are disposed on or near a specific body part to be imaged (e.g., head, orthopedic, breast imaging).

SUMMARY

Various embodiments of the present invention provide a high temperature superconductor cryogenically cooled whole-body RF coil array. Some embodiments of the whole-body cryogenically cooled RF coil array provide for sufficient SNR such that the whole-body cryogenically cooled RF coil array may be used for diagnostic imaging. Embodiments provide high SNR and large FOV, such that cryogenically cooled RF coil arrays can be used for diagnostic imaging of all body parts. As such, diagnostic imaging may be provided in an MRI whole body system by using the whole-body cryogenically cooled RF coil array itself, without requiring using special-purpose RF coils (i.e., coils designed for specific body parts) to provide diagnostic imaging. Accordingly, it may be appreciated that, among other features, this feature (i.e., eliminating the need for using special-purpose RF coils for diagnostic imaging) associated with various embodiments of the present invention provides for further advantages in terms of efficiency, patient throughput, and MRI system and imaging procedure costs.

Various embodiments of a whole-body cryogenically cooled RF coil array according to the present invention are implemented as a transceiver coil array. In some embodiments, the whole-body cryogenically cooled RF coil array is implemented as a cryogenically cooled superconductor RF coil array, and in various embodiments the superconductor is implemented as a high temperature superconductor (HTS). In various implementations, the HTS coil elements comprising the whole-body HTS RF coil array provide minimum coil resistance so as to minimize coil noise.

A whole body cryogenically cooled (e.g., HTS) RF coil array according to various embodiments may comprise a first cryogenically cooled (e.g., HTS) RF coil array module and a second cryogenically cooled (e.g., HTS) RF coil array module. The respective modules may be disposed on opposing sides of the examination region of an MRI system for whole-body imaging. The first cryogenically cooled (e.g., HTS) RF coil array module or the second cryogenically cooled (e.g., HTS) RF coil array module, or both, may be substantially planar or may be generally arcuate (arch-shaped in cross-section) so as to generally conform to a human body contour.

Various embodiments of the present invention provide a whole body RF coil array module (e.g., which may be a superconducting coil array, such as an HTS array) configured for cryogenic cooling, comprising: a vacuum thermal isolation housing comprising a double wall hermetically sealed jacket that (i) encloses a hermetically sealed interior space under a vacuum condition, and (ii) substantially encloses an interior chamber region that is separate from the hermetically sealed interior space and is configured to be evacuated to a vacuum condition; at least one RF coil array (e.g., superconducting, such as HTS) disposed in said interior chamber region and configured for at least one of transmitting/generating and/or receiving radiofrequency signals for at least one of magnetic resonance imaging and magnetic resonance spectroscopy; a thermal sink member disposed in said interior chamber region and in thermal contact with said at least one RF coil array; and a port configured for cryogenically cooling at least the thermal sink member.

In some embodiments, the port is coupled to a cryocooler that is thermally coupled to at least the thermal sink member. The coupling of the cryocooler to the port may provide for sealing the interior chamber region such that the interior chamber region is under a vacuum condition.

The hermetically sealed jacket may be sealedly joined to a chamber having an interior space that is coextensive with and is configured to be evacuated to substantially the same vacuum condition as the interior chamber region, wherein the port is provided in said chamber. The chamber may be configured as a double walled chamber (e.g., a double-walled stainless steel chamber) that encloses a hermetically sealed intra-wall cavity that is under vacuum.

In accordance with some embodiments, the module may also comprise at least one gradient coil disposed within said interior chamber region, wherein the at least one gradient coil is configured for generating one or more magnetic field gradients for at least one of magnetic resonance imaging and magnetic resonance spectroscopy. One or more of the at least one gradient coil may be in thermal contact with the thermal sink member. One or more of the at least one gradient coil may comprise a superconductor material, which may be a high temperature superconductor (HTS) material.

In accordance with various embodiments, one or more cooling systems may be used for cooling the main magnet, the at least one gradient coil, and the at least one superconductor RF coil array. In some embodiments, the superconducting main magnet is configured for cooling by a first cryogenic cooling system, the at least one superconductor RF coil array is configured for cooling by a second cryogenic cooling system, and the at least one gradient coil is configured for cooling by a third cryogenic cooling system. In some embodiments, the superconducting main magnet is configured for cooling by a first cryogenic cooling system, and the at least one superconductor RF coil array is/are configured for cooling by a second cryogenic cooling system. In some embodiments, the superconducting main magnet, the at least one RF coil array, are configured for cooling by a common cryogenic cooling system. Additionally, in some implementations, where the RF coil array comprises a plurality of RF coil array modules, each module may be separately cooled, or two or more of the modules may be cooled commonly (e.g., by the same cryogenic cooling system).

It will be appreciated by those skilled in the art that the foregoing brief description and the following detailed description are exemplary and explanatory of the present invention, but are not intended to be restrictive thereof or limiting of the advantages which can be achieved by this invention in various implementations. Additionally, it is understood that the foregoing summary and following detailed description are representative of some embodiments of the invention, and are neither representative nor inclusive of all subject matter and embodiments within the scope of the present invention. Thus, the accompanying drawings, referred to herein and constituting a part hereof, illustrate embodiments of this invention, and, together with the detailed description, serve to explain principles of embodiments of the invention.

BRIEF DESCRIPTION OF THE DRAWINGS

Aspects, features, and advantages of embodiments of the invention, both as to structure and operation, will be understood and will become more readily apparent when the invention is considered in the light of the following description made in conjunction with the accompanying drawings, in which like reference numerals designate the same or similar parts throughout the various figures.

FIGS. 3A and 3B schematically depict a plan view and side view, respectively, of an illustrative whole-body HTS RF coil array, in accordance with some embodiments of the present invention;

DETAILED DESCRIPTION

As will be understood by those skilled in the art in view of the ensuing description, cryogenically cooled superconducting whole-body RF coil array modules according to various embodiments of the present invention may be implemented in myriad whole-body magnetic resonance imaging and spectroscopy systems, such as open or closed systems, including systems employing conventional copper gradient coils, as well as systems employing superconducting gradient coils (e.g., such as in systems disclosed in U.S. patent application Ser. No. 12/416,606, filed Apr. 1, 2009, and U.S. patent application Ser. No. 12/762,901, filed Apr. 19, 2010, each of which is hereby incorporated by reference its entirety). It will also be understood by those skilled in the art that while various portions of the ensuing description may be set forth in the context of an MRI system that may be used for structural examination of a patient, cryogenically cooled (e.g., superconducting) whole body RF coil module arrays according to various embodiments of the present invention may be employed in connection with magnetic resonance (MR) systems operated and/or configured for other modalities, such as functional MRI, diffusion weighted and/or diffusion tensor MRI, MR spectroscopy and/or spectroscopic imaging, etc. Additionally, as used herein, MRI includes and embraces magnetic resonance spectroscopic imaging, diffusion tensor imaging (DTI), as well as any other imaging modality based on nuclear magnetic resonance.

In the ensuing illustrative embodiments, for ease of reference and clarity of exposition, the whole body cryogenically cooled RF coil arrays are, by way of example, implemented as whole body HTS RF coil arrays. It will be understood, however, that in various alternative implementations one or more coils of the cryogenically cooled RF coil array may be implemented using conventional conductors (e.g., copper) and/or using low temperature superconductors (LTS), an/or using materials comprising a non-superconducting material that when cooled to a temperature below room temperature has a conductivity higher than that of copper at the temperature below room temperature (e.g., carbon nano-tube based materials and/or two-dimensional electron gas semiconductor structures). Preferably, whole body RF coil arrays implemented with any such materials provide for diagnostic whole-body imaging, without requiring use of dedicated RF coils.

Figure 1A:
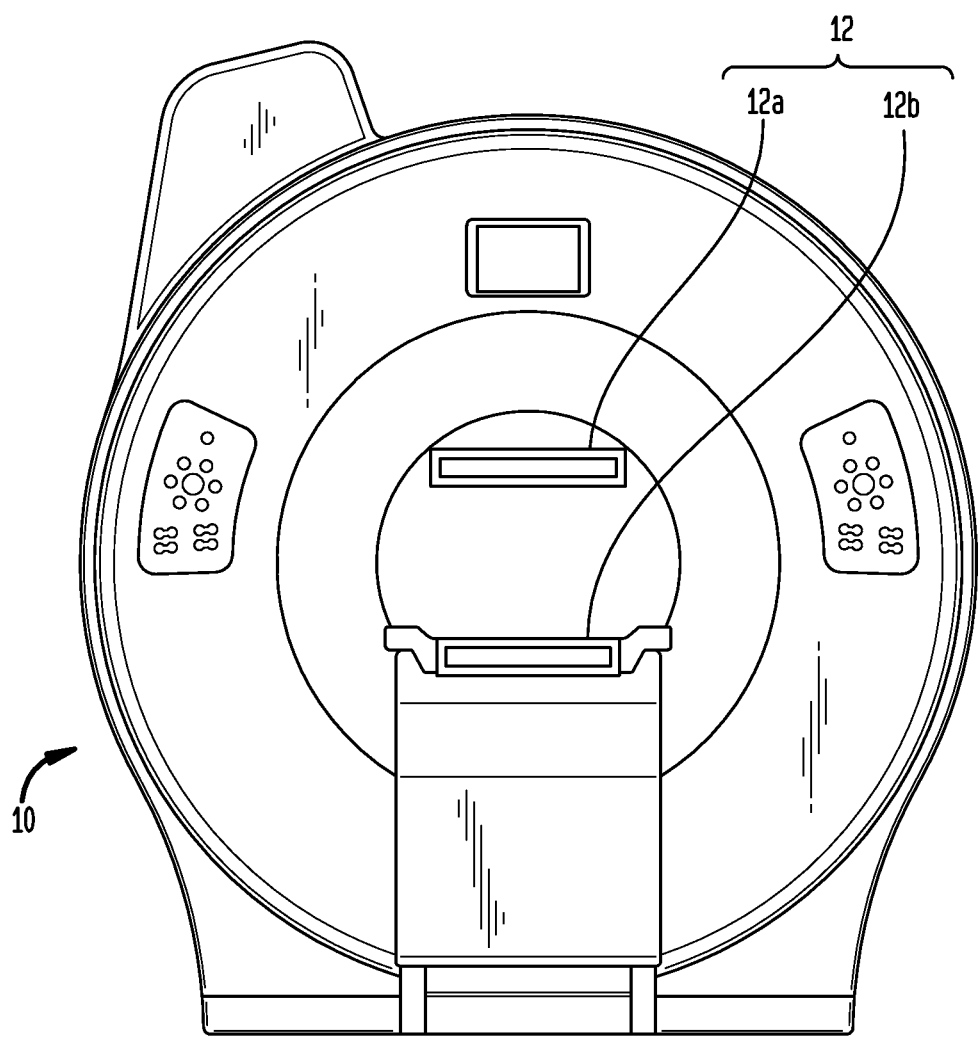
FIGS. 1A and 1B schematically depict illustrative whole-body MRI systems that comprise whole-body HTS RF coil arrays incorporated within a cylindrical superconducting magnet, in accordance with some embodiments of the present invention.
Figure 1B:
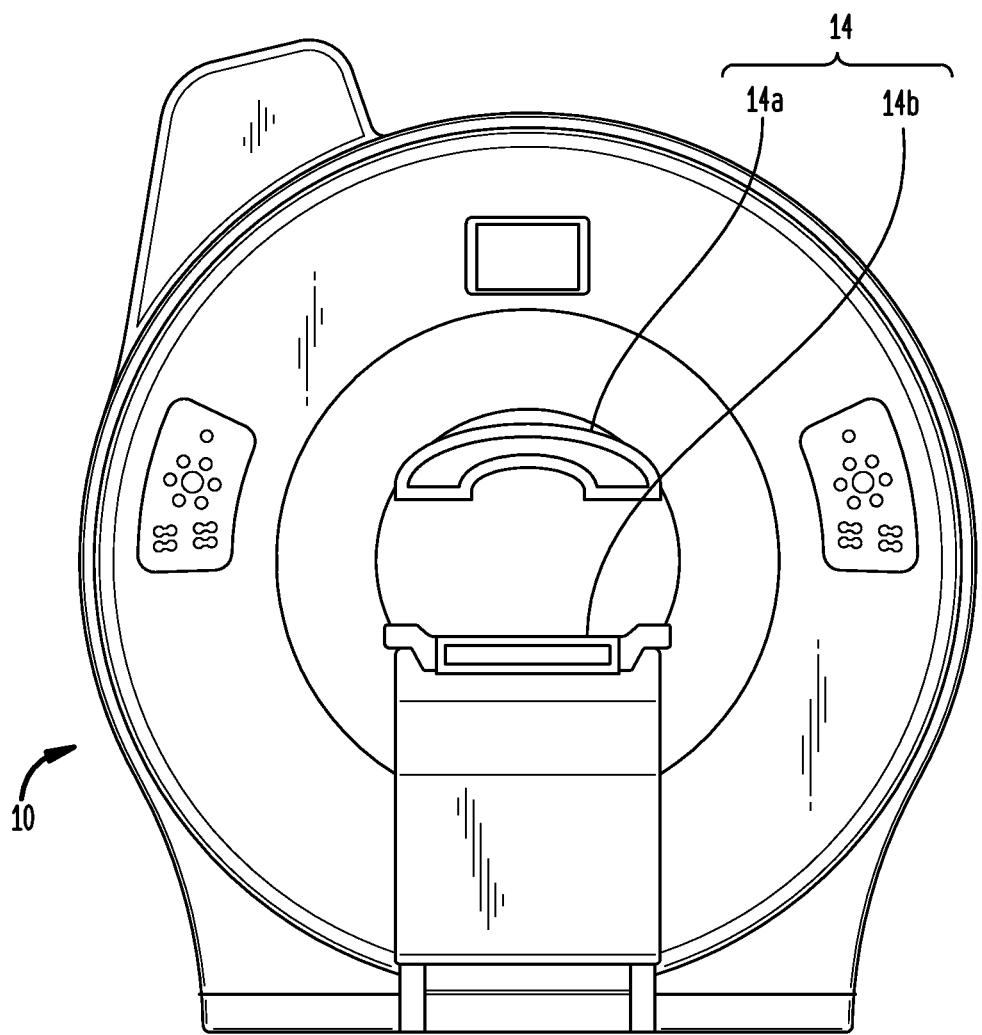
Figure 2A:
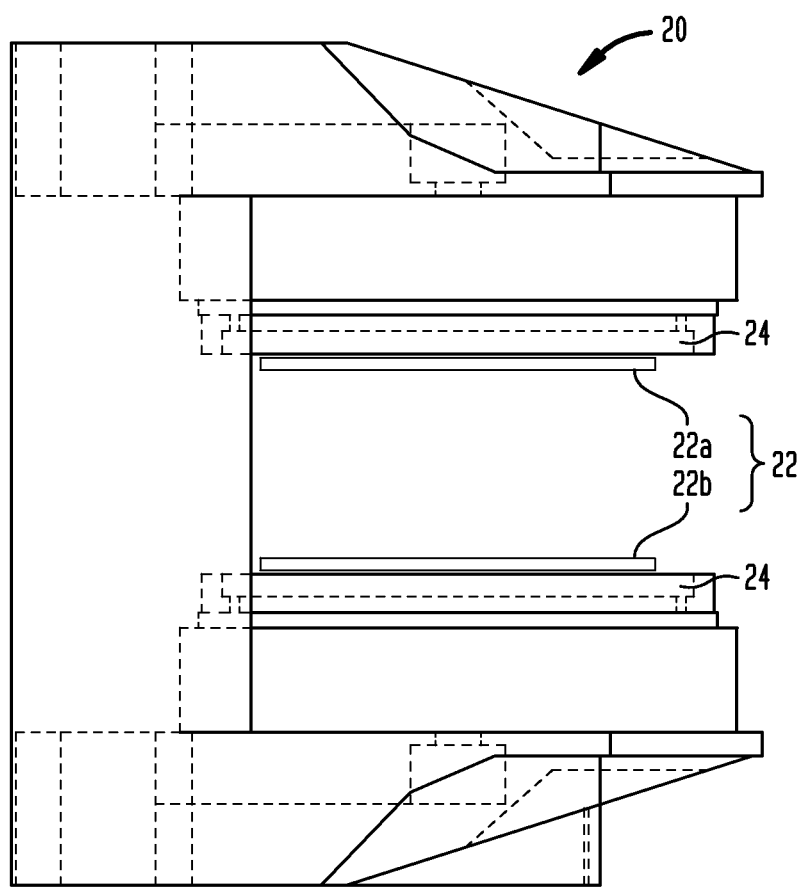
FIG. 2A schematically depicts an illustrative whole-body MRI system that comprises a whole-body HTS RF coil array incorporated within a C-shaped magnet, in accordance with some embodiments of the present invention.

FIGS. 1A, 1B, and 2A schematically depict illustrative whole-body MRI systems that may include whole-body HTS RF coil arrays in accordance with some embodiments of the present invention. For example, FIGS. 1A and 1B schematically depict respective illustrative implementations wherein HTS RF coil arrays are incorporated within a cylindrical superconducting magnet of a high field MRI scanner 10, with the HTS array coils being used as a transmitter RF coil, a receiver RF coil, and/or a transceiver RF coil. In accordance with the discussion above, HTS RF coil arrays according to various embodiments are particularly well-suited for use as a receiver and/or a transceiver coil so as to provide for low (e.g., minimal) coil noise and concomitantly high SNR for signal reception.

Figure 2B:
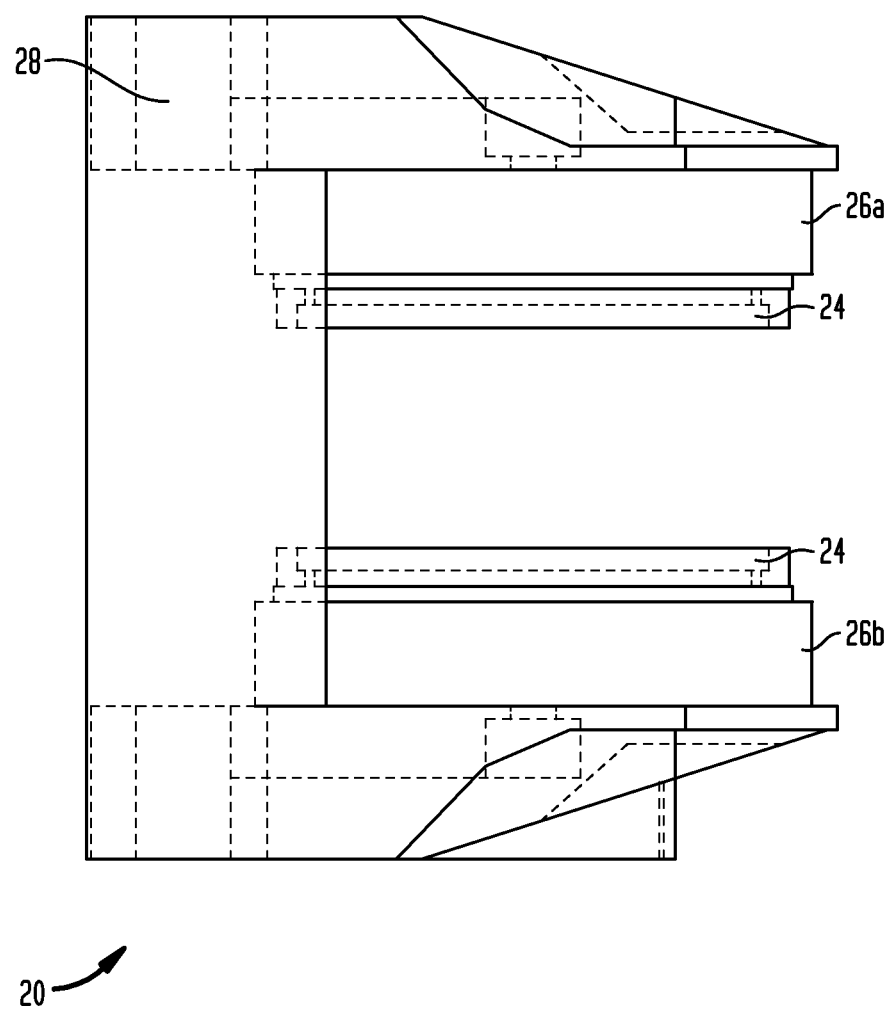
FIG. 2B depicts the permanent C-shaped magnet MRI system of FIG. 2A, but with the HTS RF coil arrays removed.

More specifically, in FIG. 1A the whole-body HTS RF coil array 12 comprises two substantially planar (e.g., flat) HTS RF array coil modules 12a and 12b, whereas in FIG. 1B the HTS RF coil array 14 comprises a first (e.g., lower) substantially planar HTS RF coil array module 14b and a second (e.g., upper) RF coil array module 14a having a generally arched or arcuate shape in cross-section so as to generally conform about the human body. As shown in FIG. 2A, some embodiments comprise a whole-body MRI system 20 that employs a C-shaped magnet (e.g., for open MRI) and includes an HTS RF coil array 22 comprising upper array module 22a and lower array module 22b disposed near the whole-body examination region and within/near the gradient coil(s) 24. For reference and clarity of exposition, FIG. 2B depicts the permanent C-shaped magnet MRI system of FIG. 2A, but with the HTS RF coil arrays removed; as shown, the C-shaped magnet includes magnetic poles 26a, 26b and yoke 28. Those skilled in the art will understand that cryogenically-cooled whole-body RF coil arrays (and array modules) according to embodiments of the present invention are not limited for implementation with only certain types of main magnets, but may be integrated in any of myriad whole-body MRI systems regardless of the magnet type or configuration (e.g., superconducting, permanent, open, closed, etc.).

It is noted that in various embodiments, such as in various implementations or variations of the above cylindrical and permanent C-shaped magnet embodiments, upper and lower whole-body HTS RF coil arrays may be implemented as mechanically separate modules, or as separate modules that may be coupled to a common cooling system, or as an integrated module (e.g., where the upper and lower array module portions are mechanically integrated/coupled at at least a portion thereof; for example, they may share a common flange and/or thermally conductive member for coupling to a cooling system). In view of the ensuing description, those skilled in the art will understand that some embodiments of whole-body HTS RF coil arrays as disclosed herein may employ techniques, materials, and principles in accordance with the disclosures of U.S. patent application Ser. No. 12/887,474, filed Sep. 21, 2010, U.S. patent application Ser. No. 12/762,901, filed Apr. 19, 2010, U.S. patent application Ser. No. 12/764,036, fled Apr. 20, 2010, and U.S. patent application Ser. No. 12/764,044, filed Apr. 20, 2010, which are herein incorporated by reference in their entirety.

Figure 3A:
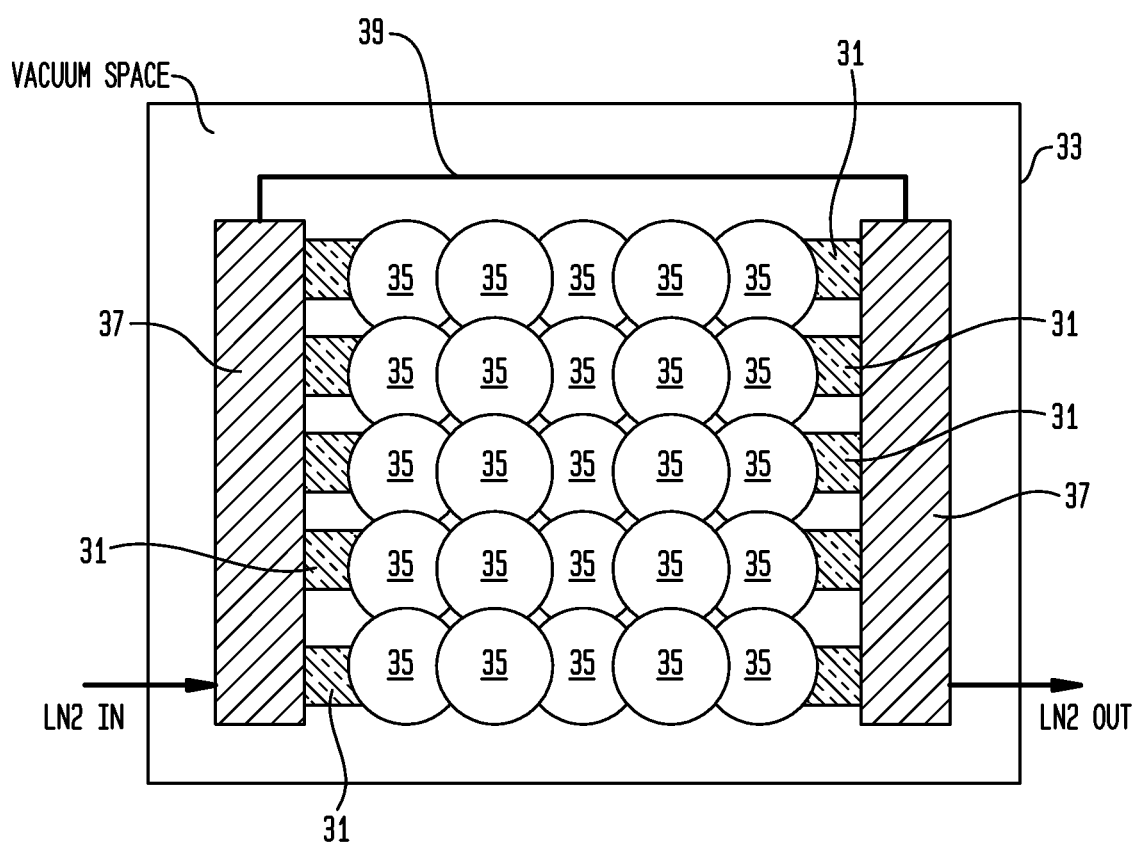

FIGS. 3A and 3B schematically depict a plan view and side view, respectively, of an illustrative whole-body HTS RF coil array, in accordance with some embodiments of the present invention. As shown, the illustrative whole-body HTS RF coil array embodiment depicted in FIGS. 3A and 3B is substantially planar and thus, for example, may be implemented as the planar HTS RF coil modules in FIG. 1A (i.e., upper and lower coil arrays), FIG. 1B (i.e., lower coil array), and FIG. 2A (i.e., upper and lower coil arrays).

More specifically, FIGS. 3A and 3B depict an illustrative HTS RF coil array comprising a vacuum enclosure 33 housing a two-dimensional array (e.g., configured, simply by way of example, as a 5-by-5 array) of HTS RF coil elements 35 (also referred to herein, in various contexts, as coils, or HTS coils, or RF coils) in thermal contact with heat conducting substrate (heat conductor) 31, which is thermally coupled to liquid nitrogen (LN2) reservoirs 37 coupled by an LN2 interconnection (e.g., conduit) 39 to provide for flow of LN2 for cryogenic cooling of the heat conductor 31 and the coils 35. Vacuum enclosure 33 maintains the array within at least a low vacuum. As shown, in this illustrative embodiment, the coils 35 are arranged in two layers to provide overlapping coils in the two-dimensional array. As will be understood, the depicted 5-by-5 array is simply one illustrative example; for instance, the number of elements in each dimension of the array need not be equal and may vary depending on, for example, the desired FOV and the design of the individual coils (e.g., size, shape, amount of overlap with neighboring coils, etc.). For example, simply by way of example, a cryogenically cooled whole-body RF coil array in accordance with some embodiments may employ any number of channels corresponding to a two-dimensional array configuration of appropriately designed coil elements as may be required to provide sufficient SNR and FOV for diagnostic whole-body imaging (e.g., 5×5, 5×10, 4×8, 8×8, 32×32, 32×64, 64×64, 100×100, 128×128, etc.).

In accordance with various embodiments of the present invention, the overall array size is sufficient for whole-body scanning and, for example, may be about 10 inches or more wide by about 10 inches or more long, and may be square or rectangular, with the same or different overall size along each dimension (e.g., some possible overall array sizes may vary from about 10" to about 40" wide by about 10" to about 40" long), such as the following: 10" wide by 10" long, 10" wide by 20" long, 10" wide by 30" long, 10" wide by 40" long, 20" wide by 20" long, 20" wide by 40" long, 40" wide by 40" long).

As shown, in the illustrative embodiment of FIGS. 3A and 3B the coil elements comprise (i) a lower layer of coils (referred to, collectively, for convenience as the "lower coil elements") each disposed in direct thermal contact with a heat conducting substrate 31 (e.g., implemented as one or more plate members; depicted as one plate member for each row) and (ii) an upper layer of (ten) coil elements (referred to, collectively, for convenience as the "upper coil elements" or "upper coils") disposed above and in thermal contact with the lower coil elements. Additional standoffs, supports, or spacers (not shown) may be used if desired, such as (i) between the upper and lower coils to thermally couple them while also preventing the trace on the upper and/or lower coil from being damaged (e.g., by providing an gap/bridge region over the trace) and/or (ii) between the upper coil elements and the plate to provide thermal coupling between the upper coil elements and the plate at regions where the lower coils do not support the upper coils. Epoxy and/or thermal grease/compound (which are not shown) may be provided between the coils and plate, and/or between the upper and lower coils, and/or between standoffs and adjoining plate and/or coil to provide thermal and mechanical contact therebetween. Additionally, in some embodiments, more than two overlapping layers of coils may be used.

Heat conducting plate 31 (and heat conducting standoffs or spacers, etc., if implemented) may be formed, for example, of any of one or more high thermal conductivity materials, such as sapphire or alumina, or other non-metallic high thermal conductivity material, such as high thermal conductivity ceramic. As shown, hereinbelow, heat conducting plate 31 is implemented as separate, parallel elongated members each of which thermally contacts a backside portion of a row of lower coil elements and the respective ends of which thermally contact the respective LN2 reservoirs. In some embodiments, each of the separate, parallel elongated members comprising heat conducting plate 31 may be narrower than the diameter of the coil elements. In various alternative embodiments, heat conducting plate 31 may be implemented as a single plate that contacts all of the lower coils, or may be implemented as two or more plates less than the number of rows of lower coils. As will be further understood below, in various embodiments cooling may be provided by using a cryocooler rather than by flowing a cryogen through the vacuum chamber of the HTS RF coil array module.

In some embodiments such as that of FIGS. 3A and 3B, each coil element 35 comprises a substrate (e.g, a sapphire wafer) and a thin film superconducting coil (also referred to as a trace). In the embodiment of FIGS. 3A and 3B, the thin film traces are formed on the upper surface (facing away from plate 31) of the substrates, though in various alternative embodiments the traces may be disposed on the lower surface (facing plate 31) of the substrates.

More particularly, in accordance with some embodiments of the present invention, the trace of each RF coil element 35 may be implemented as a high temperature superconductor (HTS), such as YBCO and/or BSCCO, etc. (e.g., using an HTS thin film or HTS tape), though a low temperature superconductor (LTS) may be used in various embodiments. For example, in some embodiments, each of RF coil elements 35 is an HTS thin film spiral coil and/or an HTS thin film spiral-interdigitated coil on a substrate such as sapphire or lanthanum aluminate. The design and fabrication of such coils is further described in and/or may be further understood in view of, for example, Ma et al., "Superconducting RF Coils for Clinical MR Imaging at Low Field," Academic Radiology, vol. 10, no. 9, September 2003, pp. 978-987; Gao et al., "Simulation of the Sensitivity of HTS Coil and Coil Array for Head Imaging," ISMRM-2003, no. 1412; Fang et al., "Design of Superconducting MRI Surface Coil by Using Method of Moment," IEEE Trans. on Applied Superconductivity, vol. 12, no. 2, pp. 1823-1827 (2002); and Miller et al., "Performance of a High Temperature Superconducting Probe for In Vivo Microscopy at 2.0 T," Magnetic Resonance in Medicine, 41:72-79 (1999), each of which is incorporated by reference herein in its entirety. Accordingly, in some embodiments, superconducting RF coil array is implemented as an HTS thin film RF coil array.

The design of each coil element (e.g., trace diameter, number of turns) may depend on the application, and may include considerations of homogeneity, signal-to-noise ratio, and field of view (FOV). As indicated above, similar considerations may factor into determining the number of coil elements that will be employed (e.g., while 5×5 coil elements are shown in the embodiment of FIGS. 3A and 3B, a two-dimensional array may include fewer or more coil elements along each dimension). While not shown in detail in FIGS. 3A and 3B, the traces of neighboring coil elements 35 overlap, with this overlap being provided by vertically displacing neighboring coil elements. Those skilled in the art will understand that the amount of overlap between neighboring coils may be optimized with respect to decoupling.

As indicated, standoffs may be employed to assist in thermal conduction (e.g., between upper coils and plate 31) and in mechanical support (e.g., assisting support of the upper coils). Using standoffs disposed over the traces of the lower coil elements may also assist in preventing damage that may occur to these traces if the upper coil elements directly contacted the lower coil elements. In various embodiments, standoffs may include a narrow recessed region that is disposed over the underlying trace of the lower coil elements (e.g., forming a bridge) such that the lower trace is not mechanically contacted by the overlying standoff.

It will be understood that in various alternative embodiments, one or more (e.g., all) of the standoffs may be eliminated. For example, some embodiments may include the standoffs between lower and upper coil elements while not employing standoffs between plate 31 and upper coil elements, as the inter-coil element standoffs may provide sufficient thermal conduction for cooling the upper coil elements. Additionally or alternatively, various embodiments may include an additional high thermal conductivity plate in direct contact with upper coil elements.

By way of non-limiting example, for illustrative purposes, in some embodiments, plate 31 may have a thickness of about 3-5 mm, each coil element trace may have a diameter of about 1 cm (or less) to about 10 cm or greater, and each coil element substrate may have a thickness of about 0.3 mm to about 0.6 mm.

While not shown in FIGS. 3A and 3B, an electronics module for each coil element may be disposed on plate 31 and/or on the coil element substrates, and may include at least a preamplifier, and may also include additional circuitry, such as for impedance matching, decoupling, etc.

As indicated above, illustrative HTS RF coil array depicted in FIGS. 3A and 3B is disposed in a vacuum chamber and is cooled by plate 31 being thermally coupled with a cryogen (e.g., LN2). In various embodiments, the coils elements 35 may be cooled to a temperature in the range of about 4K to 100K, and more particularly, to a temperature below the critical temperature of the superconducting material (e.g., in some embodiments, below the critical temperature of a high temperature superconductor (HTS) material used for the RF coils 35). In various embodiments, rather than using a cryogen for cooling the RF coils, a cryogenic cooling system may be used comprising a cryocooler implemented as any of various single stage or multi-stage cryocoolers, such as, for example, a Gifford McMahon (GM) cryocooler, a pulse tube (PT) cooler, a Joule-Thomson (JT) cooler, a Stirling cooler, or other cryocooler.

In various alternative embodiments, the coil elements may be implemented using shapes other than circular. For example, coil elements, including the substrate and the trace, may be rectangular. Additionally, by using rectangular substrates and assembling the array using four layers of coils (using standoffs where appropriate to assist for thermal conduction and/or mechanical support), it is possible to have the traces of each adjacent coil element overlap each other (i.e., a coil element trace overlaps the traces of its nearest neighbors and next-nearest neighbors (i.e., diagonally disposed neighbors). Further, those skilled in the art will understand that such a four-layer construction may be used to provide a two-dimensional array of neighboring overlapping coil elements of arbitrary array size/dimension (e.g., 5×5, 5×10, 4×8, 8×8, 32×32, 32×64, 64×64, 100×100, 128×128, etc.). Rectangular substrates may be formed by cutting or scribing a circular substrate, such as a circular sapphire or alumina substrate. Rectangular shaped traces may provide for improved image reconstruction due to the substantially constant trace overlap distance.

Additionally, in some embodiments, rather than having coils elements comprising traces formed on respective layered substrates, an array of coil elements may be formed on a common thermally conductive substrate, which may be planar or substantially flat to provide a substantially planar RF coil array. For example, the traces may be formed using HTS tape or HTS thin films in an overlapping neighboring configuration with insulating (dielectric) spacers separating neighboring coils where they overlap.

As will be further understood in view of the ensuing description, in some embodiments the vacuum chamber 33 may be implemented, for example, as a double-walled Dewar structure. More specifically, in accordance with some embodiments of the present invention, the vacuum chamber may comprise a double-walled Dewar made of glass and/or other non-conductive, mechanically strong material(s), such as G10, RF4, plastic, and/or ceramic. In various embodiments, a double-walled Dewar may be implemented in accordance with, or similar to, the hermetically sealed double-walled structures (and vacuum thermal isolation housing) described in U.S. application Ser. No. 12/212,122, filed Sep. 17, 2008, in U.S. application Ser. No. 12/212,147, filed Sep. 17, 2008, and in U.S. Provisional Application No. 61/171,074, filed Apr. 20, 2009, each of which is herein incorporated by reference in its entirety.

As understood in view of the foregoing description, in accordance with various embodiments of the present invention, a whole-body HTS RF coil array may be implemented as a receive-only array, with an RF transmitter being implemented as a separate RF coil, which in various embodiments may be a conventional (e.g., non-superconducting, such as a conventional copper RF coil) RF transmitter coil or a superconducting RF transmitting coil. In some embodiments, whole-body HTS RF coil array may be implemented as a transmit and receive coil array (a transceiver array), with each superconducting RF coil element 14 being used for both transmission and reception of RF signals. And, in some implementations, whole body HTS RF coil array may be used as a transmit-only coil (e.g., HTS RF coil array may be a transceiver array, but used as transmit-only when used in conjunction with, for example, a receive-only surface coil array or other body-part-specific RF receive-only coil).

In accordance with various embodiments of the present invention, one or more of the superconducting HTS RF coil elements 35 may be implemented as a multiple resonance RF coil element (e.g., comprising two or more receiving coils having different resonant frequencies, such as for detecting sodium and hydrogen resonances at a given magnetic field (e.g., at 3 Tesla (T)).

Figure 4:
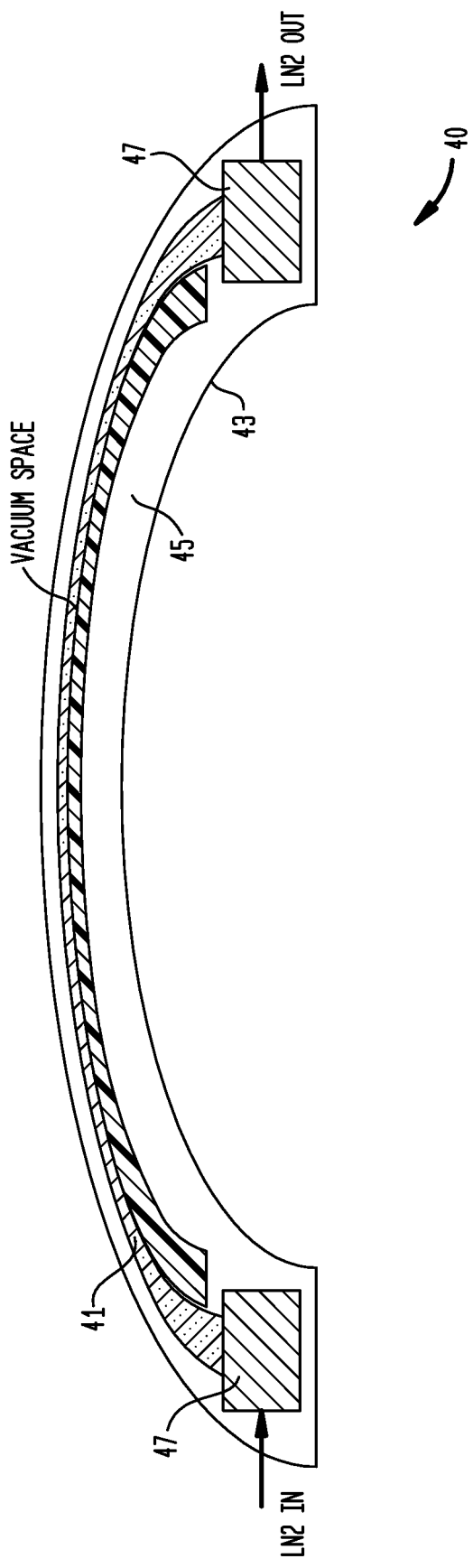
FIG. 4 schematically depicts a cross-sectional view of a whole-body HTS RF coil array having an arcuate or generally arched curvature, in accordance with some embodiments of the present invention.

Referring now to FIG. 4, there is shown a cross-sectional view of a whole-body HTS RF coil array 40 having an arcuate or generally arched curvature in accordance with some embodiments, such as may be implemented for the upper coil array depicted in FIG. 1B. Various embodiments of coil array 40, and variations thereof, may be implemented similarly to the foregoing description of substantially planar/rectilinear whole-body HTS RF coil arrays. For instance, the vacuum chamber/wall 43 and heat conductor 41 may be formed using the same types of materials, but are preformed with the desired curvature. Also, (like the foregoing planar/rectilinear coil array modules), while in the illustrative embodiment of FIG. 4 cooling is provided by supplying a cryogen (e.g., LN2) to input and output reservoirs 47 (conduit therebetween not shown in FIG. 4) that are in thermal contact with the ends of the heat conductor 41, in alternative implementations cooling may be provided by a cryocooler. In FIG. 4, an HTS tape coil array 45 is used for implementing the coil elements. In some embodiments, such an HTS tape coil array 45 comprises HTS tape coil elements disposed, in overlapping neighboring configuration, on a curved thermally conductive (e.g., alumina or sapphire) support/substrate. Insulating (dielectric) spacers are provided where neighboring coils overlap. The curved thermally conductive substrate of the HTS coil array 45 is thermally coupled to the heat conductor 41, which is cooled via its ends by the LN2 provided in the LN2 reservoirs 47. While the tape coil array may be easier to form using a curved substrate, alternative implementations of a curved whole-body HTS RF coil array (e.g., coil array 40) may nevertheless employ HTS thin films, which, for example, may be formed on respective substrates that are configured (e.g., layered) for overlap, or may be formed (e.g., patterned) onto a common heat conducting substrate (with a insulating spacer layers disposed where neighboring traces overlap).

As discussed in connection with the foregoing illustrative embodiments, possible types of RF coil materials include HTS tapes and HTS thin films. By way of example, a suitable form of an HTS RF coil for this application is a superconductor tape made by, for example, Bismuth Strontium Calcium Copper Oxides (BSCCO). For example, detailed teaching of fabricating HTS RF coils from HTS tape is described in U.S. Pat. No. 6,943,550, the disclosure of which is incorporated herein by reference. In alternative embodiments, the superconductor RF coil may be implemented as a superconductor thin film, such as a superconductor thin film comprising an HTS material such as Yttrium Barium Copper Oxide (YBCO), Thallium-Barium-Calcium-Copper Oxide (TB-CCO), MgB2, or MB, wherein M is selected from the group consisting of Be, Al, Nb, Mo, Ta, Ti, Hf, V, and Cr. Detailed teaching of fabricating HTS film coil on a flat substrate is described in Ma et al, "Superconducting MR Surface Coils for Human Imaging," Proc. Mag. Res. Medicine, 1, 171 (1999) and the disclosure of which is incorporated herein by reference in its entirety. Additional teachings concerning HTS coils are described in Ma et al., "Superconducting RF Coils for Clinical MR Imaging at Low Field," Academic Radiology, vol. 10, no., 9, September 2003, pp. 978-987, and in Miller et al., "Performance of a High Temperature Superconducting Probe for In Vivo Microscopy at 2.0 T," Magnetic Resonance in Medicine, 41:72-79 (1999), the disclosures of which are incorporated herein by reference in their entirety.

Figure 5A:
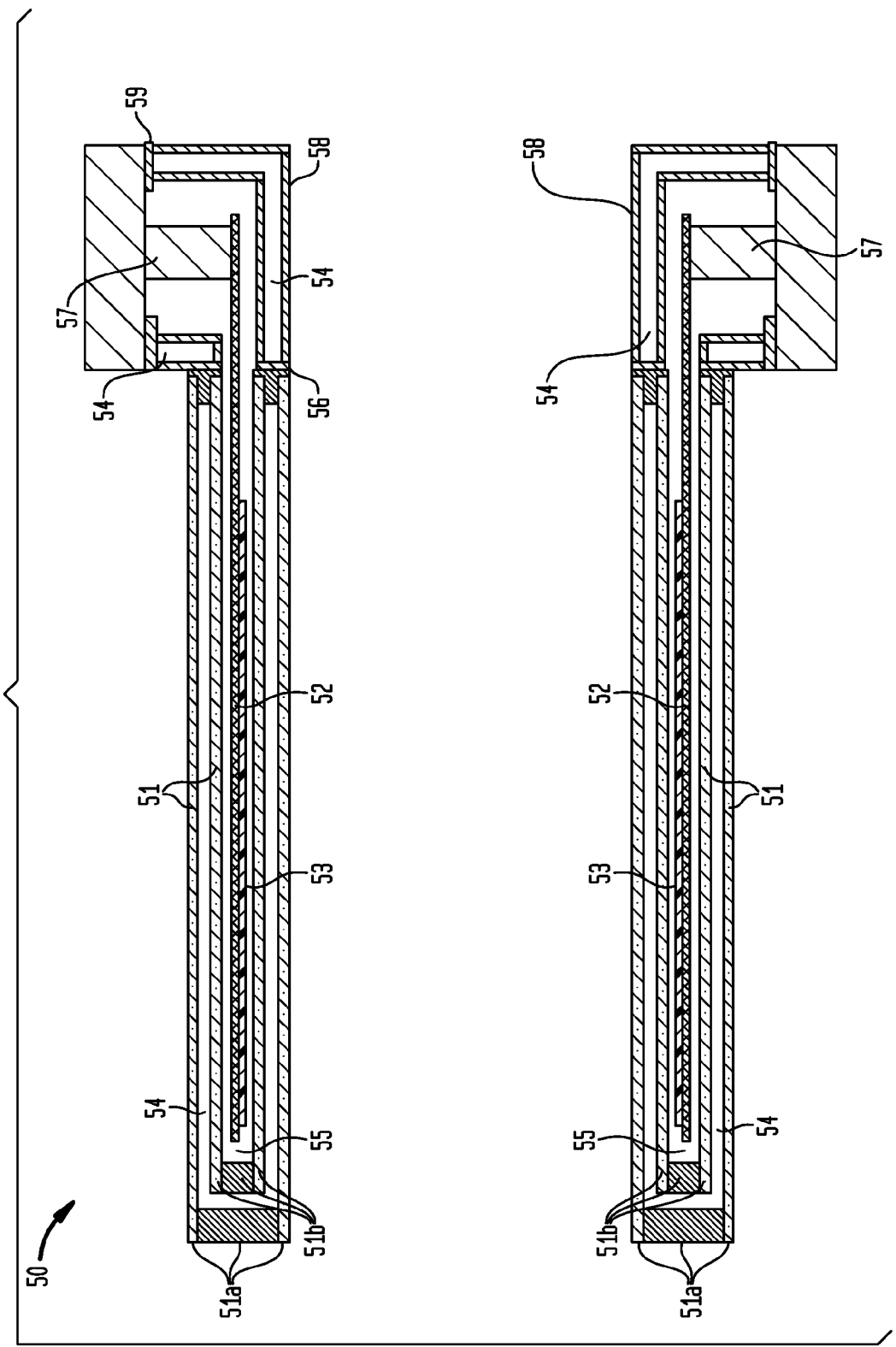
FIGS. 5A and 5B schematically depict orthogonal views of an illustrative cryogenically cooled whole-body HTS RF coil array module having a generally planar shape, in accordance with some embodiments of the present invention.
Figure 5B:
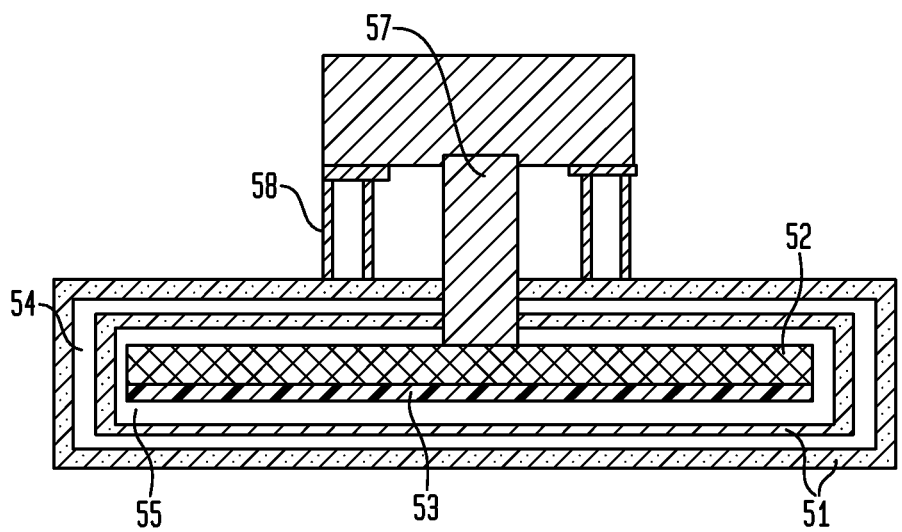

FIGS. 5A and 5B schematically depict orthogonal views of an illustrative cryogenically cooled whole-body HTS RF coil array module 50 having a generally planar shape, in accordance with some embodiments of the present invention. As shown, module 50 comprises an upper module and a lower module corresponding, for example, to the upper and lower coil array modules schematically depicted in FIG. 1A and FIG. 2A. More specifically, FIG. 5A is a cross-sectional view along the longitudinal axis, whereas FIG. 5B is generally a plan or end-on view of the upper module of FIG. 5A, viewed from the left-hand side of FIG. 5A, but showing a cut-away or cross-section of stainless steel chamber 58 to reveal the portion of cryocooler 57 within the chamber 58.

As depicted in FIGS. 5A and 5B, in some embodiments cryogenically cooled whole-body HTS RF coil array module 50 includes upper and lower modules each comprising (i) a double-walled Dewar 51 made of glass and/or other non-conductive, mechanically strong materials, such as G10, RF4, plastic, and/or ceramic; (ii) a non-metallic thermal conductor 52, such as a high thermal conductivity ceramic, such as sapphire or alumina; (iii) superconductor (e.g., HTS) RF coil arrays 53 that are in good thermal contact with thermal conductor 52; (iv) a double-walled stainless steel chamber 58 that is sealably coupled to double-walled Dewar 51; and (v) a cryocooler 59 thermally coupled to thermal conductor 52 and sealably mounted to a flange of stainless steel chamber 58. Although not shown in detail in FIGS. 5A and 5B, RF coils arrays 53 may be implemented, for example, similar to the coil elements in FIGS. 3A and 3B, with each coil element comprising a trace formed on a substrate, and with coil elements layered such that neighboring traces thereof overlap. In some embodiments, the coil elements of coil arrays 53 may be implemented as HTS thin film traces or HTS tape (e.g., YBCO, BSCCO, etc.) traces formed on a planar thermally conductive substrate, with insulating members formed between overlapping portions of the traces.

It will be understood that double-walled Dewar 51 may be constructed in a variety of ways, as a continuous, hermetically sealed glass housing enclosing an interior chamber (or cavity) 54 in which at least a low vacuum condition and, in accordance with some embodiments, preferably at least a high vacuum condition (e.g., about $10^{-6}$ Torr or lower pressure) is maintained. For example, in accordance with some embodiments, double-walled Dewar 51 may be manufactured as follows: (i) forming two generally planar/rectilinear double-walled structures each having a generally U-shaped wall cross-section, the first corresponding to continuous glass wall portion 51a and the second corresponding to continuous wall portion 51b, (ii) fitting the generally rectilinear continuous glass wall portion 51b into the annular space of generally rectilinear continuous glass wall portion 51a, possibly using glass spacers therebetween, and (iii) pumping the cavity 54 to a high vacuum and glass-bonding, fusing, or otherwise sealing the open end between 51a and 51b (i.e., the end that is later sealably mounted to stainless steel chamber 58) to hermetically seal cavity 54 under high vacuum. It may be appreciated that the vacuum sealing step may be performed in myriad ways. For example, it may be performed entirely within a vacuum chamber, or the ends of 51a and 51b may be fused to each other except for a small region that is used as a vacuum pumping port and that is sealed after pumping the cavity to high vacuum therethrough. In various embodiments, double-walled Dewar 51 may be implemented in accordance with principles and techniques employed in connection with the hermetically sealed double-walled structures (and vacuum thermal isolation housing) described in U.S. application Ser. No. 12/212,122, filed Sep. 17, 2008, and in U.S. application Ser. No. 12/212,147, filed Sep. 17, 2008, each of which is herein incorporated by reference in its entirety.

By way of example, the joint between the hermetically sealed double-walled Dewar 51 (e.g., glass) and the stainless steel chamber may be formed by epoxy bonding (e.g., epoxy bond/seal 56 in FIG. 5A), welding, or other hermetically sealed flange connection, providing a sufficient seal to maintain at least a low vacuum condition (e.g, about $10^{-2}$ to about $10^{-5}$ Torr) in the interior chamber portion 55 that houses the gradient coils 53 and thermal conductor 52. Also by way of example, the vacuum seal between cryocooler 59 and the flange of stainless steel chamber 58 may be provided by an O-ring or other sealing mechanism (e.g., metal gasket/knife-edge connection) to, similarly, maintain the at least low vacuum condition in the interior chamber portion 55 that houses the gradient coils 53 and thermal conductor 52. Those skilled in the art understand, however, that chamber 58 may be made of materials other than stainless steel, e.g., aluminum or other metallic or other non-metallic material, such as glass, ceramic, plastics, or combination of these materials, and such other materials may be appropriately joined to Dewar 51 and cryocooler 59.

In various embodiments, cryocooler 59 may be implemented as any of various single stage or multi-stage cryocoolers, such as, for example, a Gifford McMahon (GM) cryocooler, a pulse tube (PT) cooler, a Joule-Thomson (JT) cooler, a Stirling cooler, or other cryocooler. In various alternative embodiments, the whole-body HTS RF coil array module 50 may be configured for cooling such that coils 53 are cooled by a cryogen, such as liquid helium and liquid nitrogen.

While in the illustrative embodiment of FIGS. 5A and 5B, the upper and lower modules are implemented as separate modules having separate cryocoolers, in some implementations a common cryocooler may be used to cool both the upper and lower modules. Additionally, in various embodiments upper and lower modules may be integrated by, for example, having a common evacuated stainless steel chamber portion. In some such an embodiments, a single cryocooler may cool both upper and lower arrays by thermally coupling the cryocooler to both the upper and lower non-metallic thermal conductor 52, such as via a further thermally conductive member disposed within the chamber for thermally coupling the upper and lower non-metallic thermal conductors 52.

Figure 6:
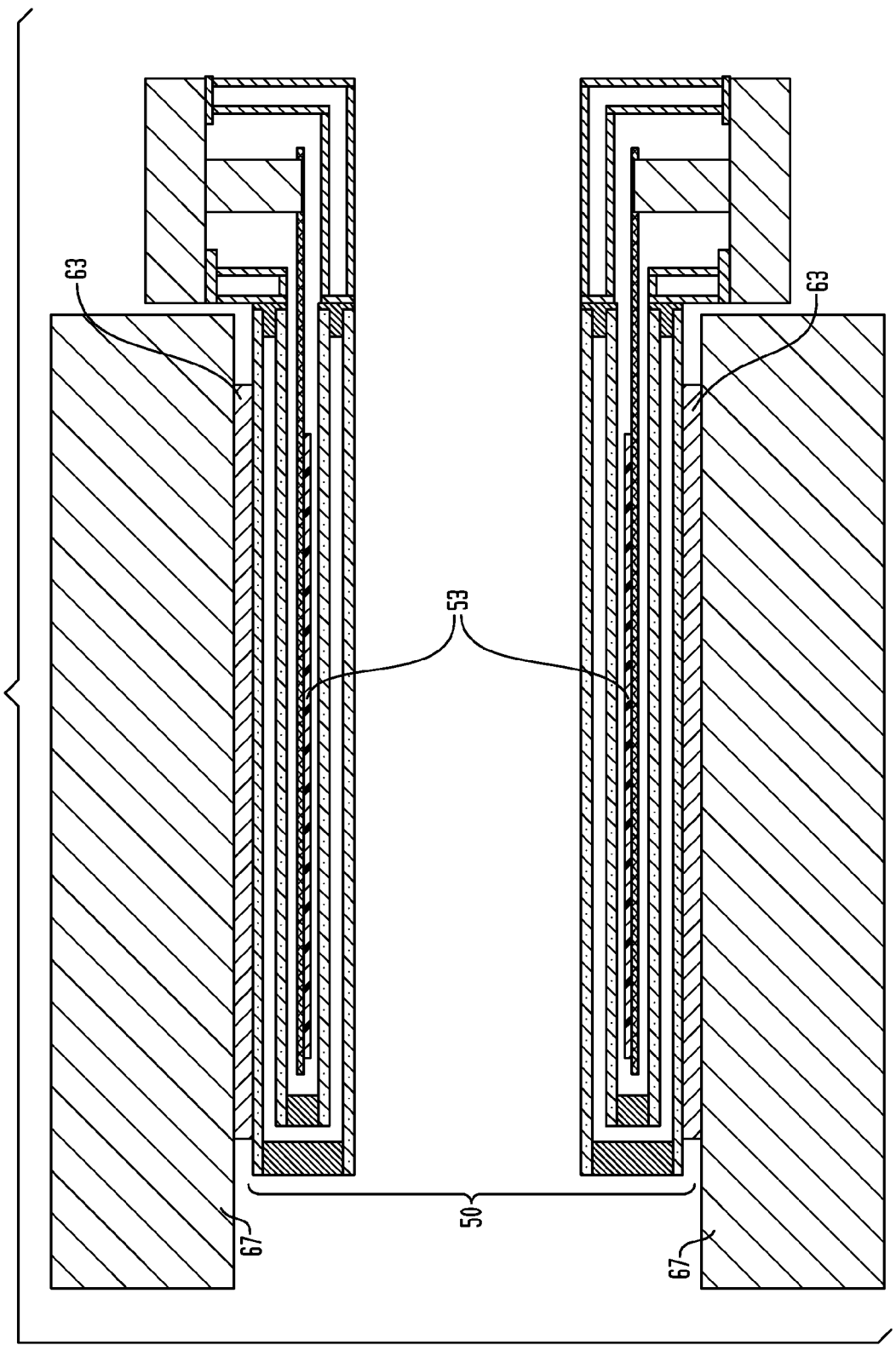
FIG. 6 schematically depicts a longitudinal cross section of a cylindrical MRI system having a whole-body examination region in which a whole-body HTS RF coil array module is disposed, in accordance with some embodiments of the present invention.

As will be understood by those skilled in the art, such a generally planar/rectilinear shaped whole-body HTS RF coil module 50 as depicted in FIGS. 5A and 5B according to some embodiments of the present invention is well suited for use in a variety of whole-body MRI systems, such as MRI systems employing a C-shaped permanent magnet (e.g., FIG. 2A), MRI systems employing a cylindrical, solenoid main magnet structure (e.g., FIG. 1A), MRI systems employing a double-donut magnet, etc. A cylindrical MRI system is schematically depicted in FIG. 6 in longitudinal cross section, and includes main magnet 67 having a whole-body examination region in which whole-body HTS RF coil array module 50 is disposed, and which also includes gradient coil(s) 63 disposed external to module 50 and between module 50 and the main magnet 67.

Figure 7:
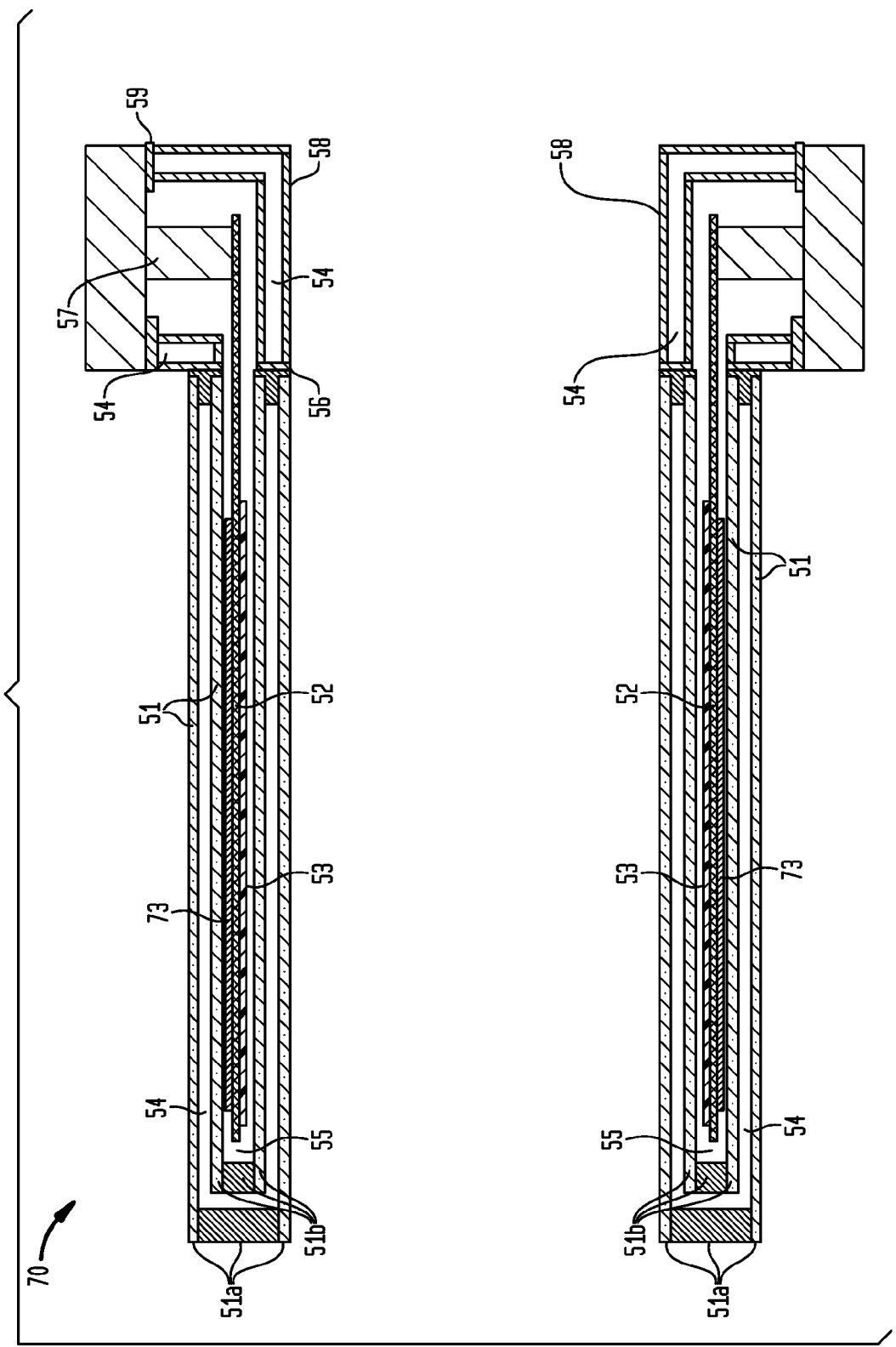
FIG. 7 schematically depicts a longitudinal cross-section of a cryogenically cooled whole-body HTS RF coil array module containing at least one gradient coil, in accordance with some embodiments of the present invention.

It will also be understood that while some embodiments of a whole-body HTS RF coil array, such as the embodiment shown in FIGS. 5A and 5B, are configured for use with one or more gradient coils that are external to the cryogenically cooled whole-body HTS RF coil array, in accordance with some embodiments of the present invention one or more gradient coils may alternatively or additionally be disposed within the whole-body HTS RF coil array module. For example, in accordance with some embodiments such as depicted in FIG. 7, gradient coil(s) 73 is/are disposed in good thermal contact with the same heat sink (i.e., thermal conductor 52) that is in thermal contact with the RF coils 53. In various embodiments, gradient coil(s) 73 disposed in thermal contact with thermal conductor 52, and thus subject to cryogenic cooling, may be implemented as one or more conventional copper coil and/or as one or more superconductor RF coil (LTS and/or HTS) and/or as one or more coils comprising a non-superconducting material that when cooled to a temperature below room temperature has a conductivity higher than that of copper at the temperature below room temperature (e.g., carbon nano-tube based materials and/or two-dimensional electron gas semiconductor structures). By way of example, a suitable form of an HTS gradient coil for this implementation is a superconductor tape made by, for example, Bismuth Strontium Calcium Copper Oxides (BSCCO), though in alternative embodiments, the superconductor gradient coil may be implemented as a superconductor thin film, such as a superconductor thin film comprising an HTS material such as Yttrium Barium Copper Oxide (YBCO), Thallium-Barium-Calcium-Copper Oxide (TB-CCO), MgB2, or MB, wherein M is selected from the group consisting of Be, Al, Nb, Mo, Ta, Ti, Hf, V, and Cr.

As will be understood by those skilled in the art, regardless of whether gradient coil is within (e.g., gradient coil 73) or without (e.g., gradient coil 63) the whole-body HTS RF coil array module, RF coil array 53, in some embodiments, may be implemented as separate coil arrays for the RF transmitter and the RF receiver, or as a common coil array for both the transmitter and the receiver. Additionally, in some embodiments where the transmitter and receiver coils of the coil array are separate coils, only one of the coil arrays (e.g., the receiver coil array) may be implemented as a superconducting coil (e.g., the other coil array may be implemented as a conventional copper coil array disposed, for example, external to HTS RF coil array module, whereas the superconducting RF coil array elements may, for example, be disposed on thermal conductor 52 within HTS RF coil array module). Additionally, where the HTS RF coil array is implemented as a receive-only array, the transmitter may be external to the RF coil array module and may be implemented as a conventional transmitter coil (e.g., not as a coil array).

It is further understood that while not shown in the drawings, a cryogenically cooled whole-body HTS RF coil array module in accordance with various embodiments of the present invention includes at least one electrical feedthrough (e.g., through chamber 58) to provide for coupling electrical signals into and/or out of the module (e.g., for coupling signals to and/or receiving signals from the RF coil array elements; for driving gradient coils if disposed in the whole-body RF coil array, for controlling and/or monitoring any sensors (e.g., pressure and/or temperature, etc.) that may be provided in the module). It is also understood that in accordance with various embodiments of the present invention, a whole-body HTS RF coil array module having a glass dewar may include (i) a coating (e.g., plastic or polymer) formed on the glass to provide protection (e.g., against breaking, chipping, or cracking) and/or additional strength etc., and/or (ii) a rigid sleeve (e.g., formed of plastic or G10) may be provided into which the glass dewar fits to provide for such protection and/or additional strength.

The present invention has been illustrated and described with respect to specific embodiments thereof, which embodiments are merely illustrative of the principles of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases, the order of process steps may be varied, and various illustrative steps may be combined, altered, or omitted, without changing the purpose, effect or import of the methods described. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof.

What is claimed is:

1. A whole-body cryogenically cooled RF coil array for receiving signals from and/or transmitting signals to a human body during magnetic resonance imaging, the cryogenically cooled RF coil array comprising:
   at least one thermally conductive member, each configured to be cryogenically cooled; and
   a plurality of coil elements thermally coupled to each thermally conductive member, wherein each coil element is thermally coupled to at least one of said at least one thermally conductive member such that each coil element is configured for cryogenic cooling via thermal conduction to the at least one thermally conductive member thermally coupled thereto, and wherein each coil element is configured to receive signals from and/or transmit signals to a spatial region that is contiguous with and/or overlaps a spatial region (i) from which at least one other of the plurality of coils is configured to receive signals and/or (ii) to which at least one other of the plurality signals is configured to transmit signals, and wherein the plurality of coil elements are configured to provide an overall field of view (FOV) of sufficient extent for whole-body imaging of an adult human when the whole-body cryogenically cooled RF coil array is disposed in a magnetic resonance imaging (MRI) system; and
   a housing that encloses (i) each of said at least one thermally conductive member and (ii) each of said plurality of coil elements under a vacuum condition.

2. The whole-body cryogenically cooled RF coil array according to claim 1, wherein each coil element comprises at least one of a high temperature superconducting (HTS) material and a low temperature superconducting material.

3. The whole-body cryogenically cooled RF coil array according to claim 2, wherein each coil element includes a sapphire substrate directly or indirectly thermally coupled to said thermally conductive member, and said thermally conductive member is an alumina or sapphire plate.

4. The whole-body cryogenically cooled RF coil array according to claim 1, wherein at least one of the coil elements comprises superconducting tape disposed on a generally arcuate support structure that is thermally coupled to said thermally conductive member, and said thermally conductive member is an alumina or sapphire plate having a generally arcuate configuration to corresponding to that of the support structure, and wherein the housing has a corresponding arcuate configuration so as to generally conform about a human body when the RF coil array is disposed in an MRI system for whole-body imaging of the human body.

5. The whole-body cryogenically cooled RF coil array according to claim 1, wherein the housing is substantially planar or substantially rectilinear, and the RF coil array elements are disposed in a substantially planar configuration such that the planes of any given coil elements are substantially parallel and/or coplanar.

6. The whole-body cryogenically cooled RF coil array according to claim 1, wherein the coil elements are configured as HTS coil elements that provide sufficiently high SNR to enable diagnostic imaging over the whole-body FOV.

7. The whole-body cryogenically cooled RF coil array according to claim 1, wherein each coil element corresponds to a respective channel for providing imaging within the FOV.

8. The whole-body cryogenically cooled RF coil array according to claim 7, wherein each coil element is associated with a corresponding preamplifier.

9. The whole-body cryogenically cooled RF coil array according to claim 7, wherein the number of channels is selected to provide a sufficient signal-to-noise ratio (SNR) over the FOV for whole-body imaging.

10. The whole-body cryogenically cooled RF coil array according to claim 7, wherein each coil element is implemented as an HTS coil element and is associated with a corresponding preamplifier.

11. A whole-body cryogenically cooled RF coil array, comprising:
a vacuum thermal isolation housing comprising a double wall hermetically sealed jacket that (i) encloses a hermetically sealed interior space under a vacuum condition, and (ii) substantially encloses an interior chamber region that is separate from the hermetically sealed interior space and is configured to be evacuated to a vacuum condition;
an array of superconductor RF coil elements disposed in said interior chamber region and configured for exciting and/or receiving a radiofrequency signal for magnetic resonance imaging over a field of view (FOV) sufficient for whole-body imaging;
at least one thermally conductive member disposed in said interior chamber region and in thermal contact with said array of RF coil elements; and
a port configured for cryogenically cooling the at least one thermally conductive member,
wherein each coil element is thermally coupled to at least one of said at least one thermally conductive member such that each coil element is configured for cryogenic cooling via thermal conduction to the at least one thermally conductive member thermally coupled thereto.

12. The whole body cryogenically cooled RF coil array according to claim 11, wherein the superconductor RF coil elements comprise an HTS material.

13. The whole-body cryogenically cooled RF coil array according to claim 11, wherein the superconductor RF coil elements are configured as HTS coil elements that provide sufficiently high SNR to enable diagnostic imaging over the whole-body FOV.

14. The whole body cryogenically cooled RF coil array according to claim 11, further comprising at least one gradient coil disposed within said interior chamber region.

15. The whole body cryogenically cooled RF coil array according to claim 14, wherein the at least one gradient coil is thermal contact with said thermal sink member.

16. A whole-body MRI system, comprising:
a main magnet configured to generate a main magnetic field in an examination region of the whole-body MRI system, wherein the examination region is of sufficient size to accommodate an adult human body for whole-body imaging;
at least one gradient coil configured to generate at least one magnetic field gradient within the examination region; and
a whole body cryogenically cooled RF coil array, which is an HTS RF coil array comprising a plurality of HTS RF coil elements that are (i) disposed between the main magnet and the examination region, (ii) configured for exciting and/or receiving a radiofrequency signal for magnetic resonance imaging over a field of view (FOV) within the examination region sufficient for whole-body imaging, and (iii) configured to be cryogenically cooled to a temperature below the HTS critical temperature to provide a sufficient signal-to-noise ratio for diagnostic imaging within the FOV, thereby providing for diagnostic MRI of an adult human body without using a special-purpose RF coil designed for imaging a specific body part,
wherein the whole body cryogenically cooled RF coil array comprises:
at least one thermally conductive member, each configured to be cryogenically cooled; and
a plurality of coil elements thermally coupled to each thermally conductive member, wherein each coil element is thermally coupled to at least one of said at least one thermally conductive member such that each coil element is configured for cryogenic cooling via thermal conduction to the at least one thermally conductive member thermally coupled thereto.

17. The whole body MRI system of claim 16, wherein the main magnet is configured as a superconducting solenoid magnet.

18. The whole body MRI system of claim 17, wherein the main magnet is implemented as a C-shaped permanent magnet.

19. The whole body MRI system of claim 16, wherein the HTS RF coil array comprises a thermally conductive member configured to be cryogenically cooled, and wherein each of the plurality of HTS RF coil elements is thermally coupled to said thermally conductive member and is configured to receive signals from and/or transmit signals to a spatial region that is contiguous with and/or overlaps a spatial region (i) from which at least one other of the plurality of HTS RF coil elements is configured to receive signals and/or (ii) to which at least one other of the plurality signals is configured to transmit signals.

20. The whole body MRI system of claim 16, wherein the HTS RF coil array comprises:
- a vacuum thermal isolation housing comprising a double wall hermetically sealed jacket that (i) encloses a hermetically sealed interior space under a vacuum condition, and (ii) substantially encloses an interior chamber region that is separate from the hermetically sealed interior space and is configured to be evacuated to a vacuum condition, wherein the plurality of HTS RF coil elements are disposed in said interior chamber region;
- a thermal sink member disposed in said interior chamber region and in thermal coupling with the HTS RF coil elements; and
- a port configured for cryogenically cooling at least the thermal sink member.

21. The whole-body MRI system of claim 16, wherein each HTS RF coil element corresponds to a respective channel for providing imaging within the FOV.

22. The whole-body MRI system of claim 21, wherein each HTS RF coil element is associated with a corresponding preamplifier.

23. The whole-body MRI system of claim 22, wherein the number of channels is selected to provide a sufficient signal-to-noise ratio (SNR) over the FOV for diagnostic whole-body imaging.

\* \* \* \* \*